United States Patent [19]

Tanabe et al.

[11] Patent Number: 4,893,147
[45] Date of Patent: Jan. 9, 1990

[54] COLOR PICTURE IMAGE RECORDING APPARATUS

[75] Inventors: Kazunori Tanabe; Makoto Suzuki; Kazumasa Makino; Eiji Shibata; Kazuhito Ishida; Takashi Nakata, all of Nagoya; Takashi Tomizawa, Aichi; Shigeyuki Hayashi, Nagoya; Motoshi Ohno, Mizuho; Yoichi Horaguchi, Nagoya, all of Japan

[73] Assignee: Brother Kogyo Kabushiki Kaisha, Aichi, Japan

[21] Appl. No.: 156,744

[22] Filed: Feb. 18, 1988

[30] Foreign Application Priority Data

Feb. 28, 1987 [JP] Japan .................................. 62-46524
Sep. 25, 1987 [JP] Japan ................................ 62-241075
Dec. 15, 1987 [JP] Japan ................................ 62-317848

[51] Int. Cl.⁴ ...................... G03B 27/32; G03B 27/52
[52] U.S. Cl. ...................................... 355/27; 355/72; 355/100; 355/106
[58] Field of Search ................ 355/27, 100, 104, 106, 355/72, 26; 430/138

[56] References Cited

U.S. PATENT DOCUMENTS

| | | | |
|---|---|---|---|
| 4,307,958 | 12/1981 | McIrvine | 355/26 |
| 4,399,209 | 8/1983 | Sanders et al. | |
| 4,440,846 | 4/1984 | Sanders et al. | |
| 4,536,463 | 8/1985 | Sanders | |
| 4,551,407 | 11/1985 | Sanders et al. | |
| 4,622,282 | 11/1986 | Head et al. | |
| 4,624,560 | 11/1986 | Beery | 355/100 |
| 4,701,397 | 10/1987 | Rourke et al. | |
| 4,742,374 | 5/1988 | Yamamoto et al. | 430/138 |

FOREIGN PATENT DOCUMENTS

| | | |
|---|---|---|
| 0164931 | 12/1985 | European Pat. Off. |
| 973020 | 10/1964 | United Kingdom |
| 1165782 | 10/1969 | United Kingdom |
| 1278325 | 6/1972 | United Kingdom |
| 2029590 | 3/1980 | United Kingdom |
| 2054876 | 2/1981 | United Kingdom |
| 2057152 | 3/1981 | United Kingdom |
| 2113860 | 8/1983 | United Kingdom |

OTHER PUBLICATIONS

Yule, J. A. C., "Color Reproduction in the Graphic Arts", *Neblette's Handbook of Photography and Reprography*, 1977, pp. 466-476.

Primary Examiner—Monroe H. Hayes
Attorney, Agent, or Firm—Oliff & Berridge

[57] ABSTRACT

In a color picture recording apparatus, a picture image of an original document is formed on a photosensitive and pressure-sensitive recording medium which may be either a self-coloring type or a transfer type made up of a microcapsule sheet and a developer sheet. According to one aspect of the present invention, in the recording apparatus of the type in which the transfer type recording medium is used, the copy sheets are discharged face-up so as to facilitate an operator's confirmation of the copied picture image. According to another aspect of the invention, the cut developer sheets are stacked in a sheet cassette so that the surface on which the developer material is coated is face-down so that a feeding roller for feeding out the developer sheet does not come into contact therewith. According to still another aspect of the invention, in an apparatus of the type in which a mask member is used for forming a latent image on the recording medium, the mask member and the recording medium are held in intimate contact with each other when exposure is taking place.

22 Claims, 9 Drawing Sheets

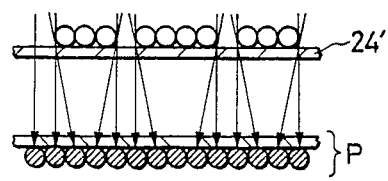
FIG. 4
PRIOR ART
FIG. 5
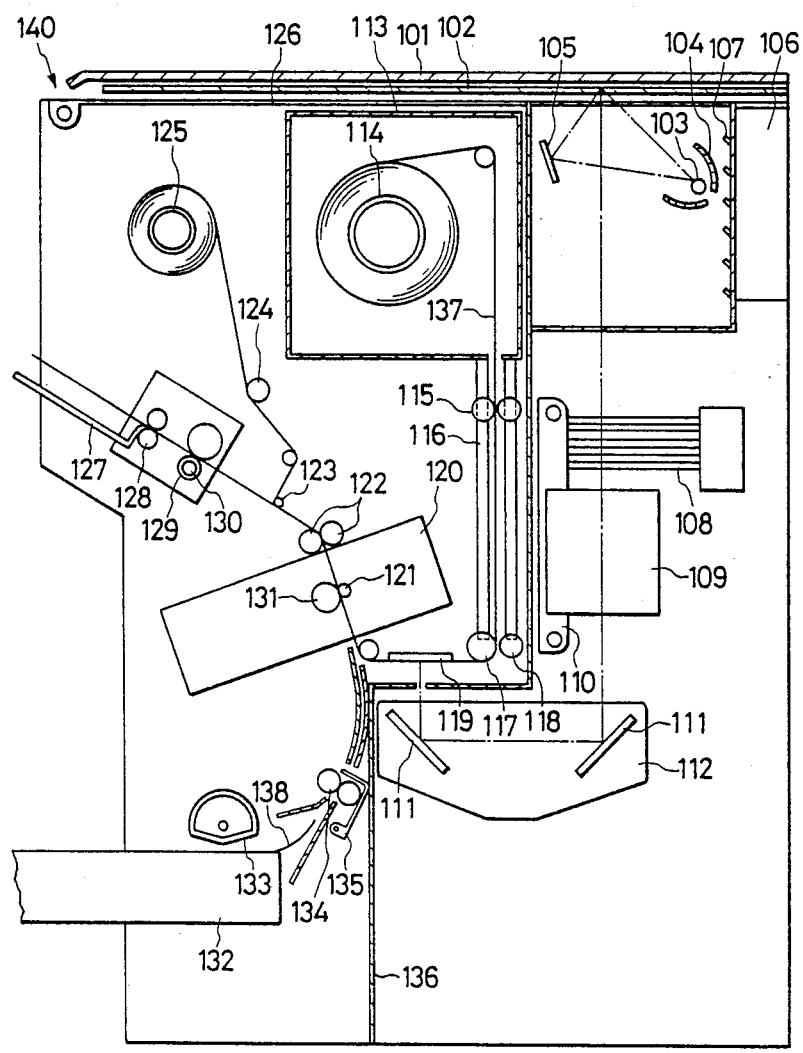

COLOR PICTURE IMAGE RECORDING APPARATUS

BACKGROUND OF THE INVENTION

The present invention relates to a color picture image recording apparatus for recording a color picture image of a color original on a recording medium.

A photosensitive and pressure-sensitive recording medium is generally used in the recording apparatus, which generally can be classified into two types, one being of a self-contained type and the other being of a transfer type. In the self-contained type recording medium, and encapsulated chromogenic material or dye precursor and a developer material are co-deposited on one surface of a single substrate as one layer or as two contiguous layers. In contrast the transfer type recording medium employs a developer material which is coated on a separate substrate as a separate developer or copy sheet. The self-contained type recording medium is disclosed in U.S. Pat. No. 4,440,846 and the transfer type recording medium is disclosed in U.S. Pat. No. 4,399,209.

Two types of prior art color picure image recording apparatus to which the present invention generally relates will be described.

The first prior art apparatus using the transfer type recording medium is shown in FIG. 1. A color original 1 to be reproduced moves in the leftward direction and is scanned by light radiated from a halogen lamp 2. The light reflected on the original is focused by a focusing lens 3 and exposed on a sheet 4 on which the encapsulated chromogenic material is coated (hereinafter referred to as a microcapsule sheet). As shown in FIG. 2, the microcapsule sheet 4 is made up of a transparent base member 4a made of resin and pressure rupturable microcapsules 4b coated on one surface of the base member 4a, each of the microcapsules 4b separately containing photo-curable resin and one of primary color chromogenic materials or dye precursors (or color formers), i.e. colors of cyan, magenta and yellow. The microcapsule sheet 4 and a separate sheet 7 on which the developer material is coated (hereinafter referred to as a developer sheet) constitute a recording medium.

A microcapsule sheet accommodating unit 6 is provided, in which an elongated web-like continuous microcapsule sheet 4 is wound around a supply shaft 5. The microcapsule sheet 4 is fed out from the accommodating unit 6 when used, and is wound around a take-up shaft 8 after being subjected to exposure. The exposed microcapsule sheet entirely wound therearound can be taken out from the recording apparatus.

A pressure-developing unit 9 performs pressure-development of the exposed microcapsule sheet 4 which carries thereon a latent image corresponding to the original and forms a visible image on a developer sheet 7. In a developer sheet cassette 9a, cut developer sheets are stacked which are urged upwardly by an urging means (not shown) secured to the bottom of the cassette 9a. The urging means is made up of a plate and a spring having one end fixed to the bottom of the cassette 9a and another end secured to the plate. A semi-circular roller 10 is rotatably provided above the cassette 9a, which feeds uppermost developer sheets 7 one by one in accordance with every rotation of the roller 10. A separation piece (not shown) is provided in the exit of the cassette 9a which serves to separate the sheets one from the other. A copy sheet is discharged to a sheet tray (not shown) after the developer sheet 7 is subjected to the pressure development.

While this apparatus is advantageous in that a developer sheet 7 can be smoothly supplied, since the developer sheet cassette 9a is disposed above the pressure-developing unit 9, it is inconvenient in that the developer sheet 7 is discharged while putting the visible image carrying surface face-down. Therefore, the operator has to reverse the developer sheet on which the visible image is formed (hereinafter referred to as a copy sheet) whenever he needs to see the copy sheet. This apparatus is further disadvantageous in that the surface of the developer sheet on which the developer material is coated is liable to be scratched or damaged when the semi-circular roller 10 is frictionally in contact therewith. As a result, a dropout of the image may occur.

Shown in FIG. 3 is another type of a prior art color picture image recording apparatus described in a co-pending U.S. patent application Ser. No. 050,313 filed on May 14, 1987 by Sangyouji et al and assigned to the same assignee, or the corresponding U.K. Patent Application Laid-Open Publication No. 2190759A. The apparatus shown in FIG. 3 uses the self-contained type photosensitive and pressure-sensitive recording sheet P.

In FIG. 3, the light radiated from a light source 12 is reflected on a color original 11 and the reflection light is directed to a photosensitive drum 16 through a first reflection mirror 13, an optical lens 14, and a second reflection mirror 15. The photosensitive drum 16 is rotatable in the direction indicated by an arrow in FIG. 3. A visible radiation spectro-filter 17 is disposed in an optical system located between an optical lens 14 and the reflection mirror 15. The spectro-filter 17 is constituted with a red filter 18 for transmitting only red light, a green filter 19 for transmitting only green light, and a blue filter 20 for transmitting only blue light. Those filters 18, 19 and 20 are provided so as to radially extend around a rotary shaft 22.

A latent image corresponding to a picture image of the original is formed on the photosensitive drum 16 and the latent image is developed by the toner powders in a developing unit 23. The developed image is transferred on a light transmissive member 24. The light transmissive member 24 on which the toner image is transferred serves as a mask member 24'. The mask member 24' is transported and then overlaid the self-contained type recording medium P. An ultraviolet source 29 is disposed above the recording medium P, and an ultraviolet-light spectro-filter 30 is disposed between the source 29 and the mask member 24'.

In the above-described apparatus, when the mask member 24' and the recording medium P are transported beneath the light source 29 while placing the former on the top of the latter, the confronting surfaces are liable to be scratched due to the surface contacts of these two members, thereby making the picture image on the recording medium blur. In order to prevent the surfaces of the mask member 24' and the recording medium P from being scratched, it is required that these two members be arranged with a spacing therebetween as shown in FIG. 4.

However, when the light is irradiated onto the mask member 24' in the condition shown in FIG. 4, the light reaching the surface of the recording medium P is diffused, and therefore the picture image is adversely made unclear.

SUMMARY OF THE INVENTION

The present invention has been made in view of the foregoing, and it is accordingly an object of the invention to provide a color picture image recording apparatus of the type using a transfer type photosensitive and pressure-sensitive recording medium in which a copy sheet is discharged with the image side being face-up. Another object of the invention is to provide a color picture image recording apparatus of the type using the transfer type photosensitive and pressure-sensitive recording sheet comprising a microcapsule sheet and a developer sheet, in which the surface of the developer sheet is not scratched or damaged.

Still another object of the invention is to provide a color picture image recording apparatus in which the image is clearly formed on a copy sheet.

In order to achieve the above and other objects the present invention provides a picture image recording apparatus of the type using the transfer type photosensitive and pressure-sensitive recording medium, in which supplying means for supplying the developer sheet is disposed in lower position with respect to a developing means so that the developer sheet is upwardly conveyed when introduced into the developing means, and after the developer sheet has been subjected to development, the resultant copy sheet is conveyed by conveying means while maintaining the copied surface face-up. In another aspect of the present invention, the cut developer sheets are stacked in a cassette while putting the surface of the developer sheet on which a developer material is coated face-down so that the developer material is not peeled off when the sheets are fed by a feeding roller.

In a picture image recording apparatus of the type in which a latent image corresponding to an original is formed on a photosensitive and pressure-sensitive recording medium by the use of a mask member, an urging means is provided for maintaining the mask member and the recording medium to be in intimate contact with each other when exposure is taking place for forming the latent image thereon.

BRIEF DESCRIPTION OF THE DRAWINGS

In the drawings:

FIG. 4 is an enlarged cross-sectional side view showing a state of exposure according to a conventional picture image recording apparatus;

FIG. 5 is a cross-sectional side view showing a color picture image recording apparatus according to a first embodiment of the present invention;

DETAILED DESCRIPTION OF THE PREFERRED EMBODIMENTS

Figure 1:
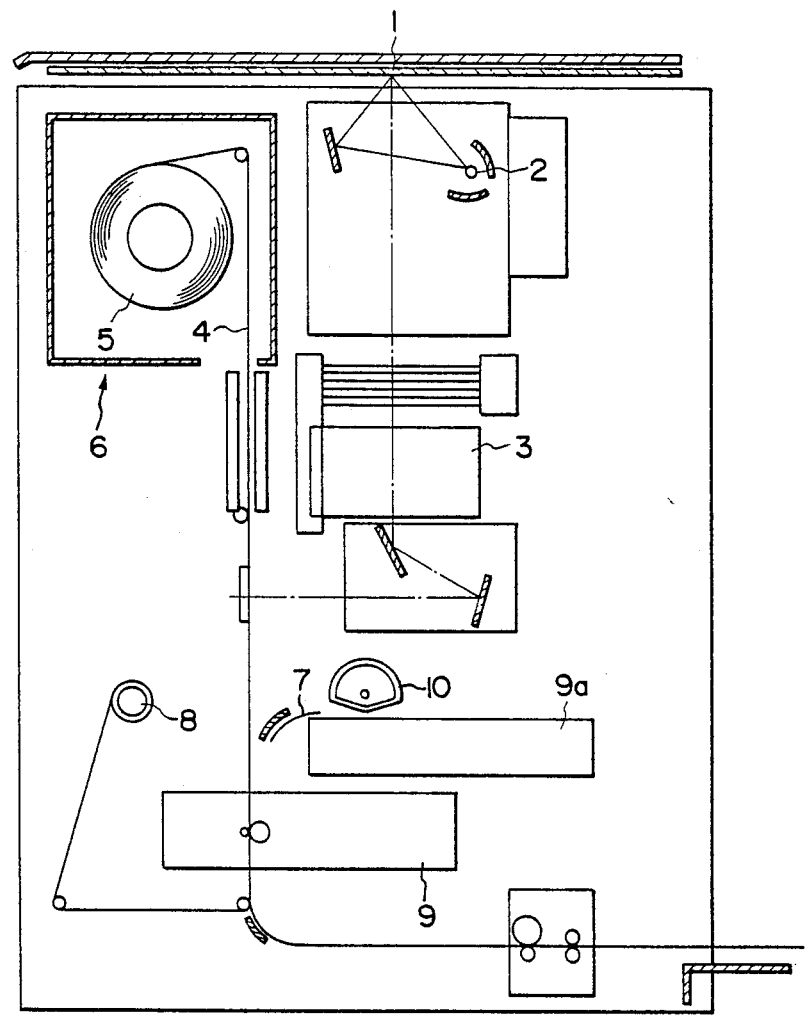
FIG. 1 is a cross-sectional side view showing a prior art color picture image recording apparatus.
Figure 2:
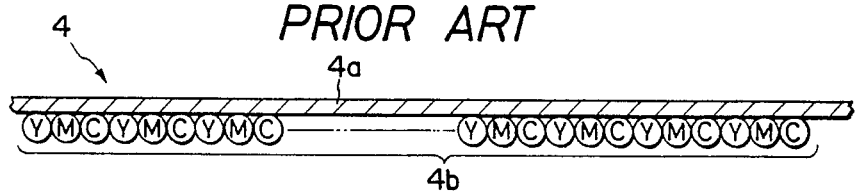
FIG. 2 is an enlarged cross-sectional side view showing a microcapsule sheet which together with a developer sheet constitutes a transfer type photosensitive and pressure-sensitive recording medium.
Figure 3:
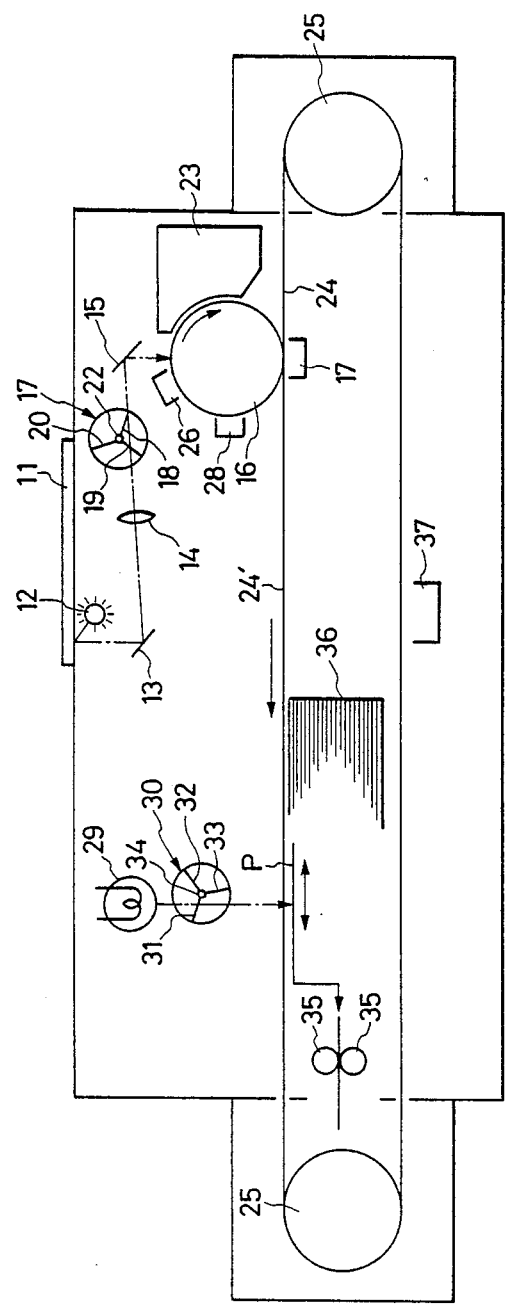
FIG. 3 is a cross-sectional side view showing another prior art color picture image recording apparatus.

Preferred embodiments of the present invention will be described with reference to the accompanying drawings.

A first embodiment of the present invention is shown in FIG. 5. The color picture image recording apparatus shown in FIG. 5 is of the type using a transfer type photosensitive and pressure-sensitive recording medium made up of a microcapsule sheet and a developer sheet.

In the top portion of the recording apparatus 140, an original-mount carriage 102 and a cover member 101 are provided so as to be movable in rightward and leftward directions. On the carriage 102, an original document is placed. In the right upper portion of the recording apparatus 140, a halogen lamp 103 and a semi-cylindrical shape reflection mirror 104 surrounding the halogen lamp 103 are provided and light is irradiated onto the carriage 102. Accordingly, the light radiated from the halogen lamp 103 is irradiated onto the entire image-carrying surface of the original through the transparent carriage 102 from the left to the right side portion in accordance with the movement of the carriage 102. The light radiated from the halogen lamp 103 is reflected on the original document. The cover member 101 serves to shield the light so as not to leak out. To the left of halogen lamp 103, a reflector 105 is provided for directing the light radiated from the halogen lamp 103 onto the original document. In the right of halogen lamp 103, a fan 106 and lower 107 are provided to introduce air into the interior of the recording apparatus.

The light reflected on the original enters into a lens 109 through a filter 108. The light transmission characteristic of the filter 108 is changed in accordance with a sensitivity characteristic of a microcapsule sheet 137 to adjust the tone of the reproduced picture image. The lens 109 is attached to a lens attachment plate 110 so that the alignment of the lens 109 with respect to an optical path can be finely adjusted. The light focused by the lens 109 is upwardly directed by a pair of reflection mirrors 111, and a latent image is formed on microcapsule sheet 137 which is held on the lower surface of an exposure stand 119. The pair of the reflection mirrors 111 are secured fixedly to a mirror attachment plate 112, and the optical path length and the focusing length are adjusted by finely adjusting the attachment position of the reflection mirrors 111.

The microcapsule sheet 137 is in an elongated, web-like continous form and is wound around a supply shaft 114. The microcapsule sheet 137 being wound therearound is accommodated in a supply unit 113 which is detachably mounted below the carriage 102. One end of the microcapsule sheet 137 extends to a take-up shaft 125 passing through a pressure-developing unit 120. Specifically, the microcapsule sheet 137 coming through the lower portion of the cartridge 113 passes through the lower surface of the exposure stand 119 while being guided by a pair of feed rollers 115 and a barrel-shaped roller 117, and then is supplied to the pressure developing unit 120. The microcapsule sheet 137 which has passed through the pressure-developing unit 120 is guided by a peel roller 123 and a meander adjusting roller 124, and is wound around the take-up shaft 125. The microcapsule sheet 137 coming through the cartridge 113 is kept from being exposed by means of a light shielding member 116.

The running speed of the microcapsule sheet 137 is controlled to be constant by a pair of feeding rollers 122 and is equal to the moving speed of the carriage 102. Accordingly, a latent image corresponding to the original is formed on the the microcapsule sheet 137 on line basis when the microcapsule sheet 137 passes through the exposure stand 119.

Below the lower portion of the pressure-developing unit 120, a sheet cassete 132 is provided in which cut developer sheets 138 are stacked. The uppermost developer sheet 138 is fed out by actuation of a semi-circular shaped roller 133 and the top end portion of the developer sheet 138 is aligned by a pair of rollers 134 and a registration gate 135. The microcapsule sheet 137 is then merged with the developer sheet 138, and both are introduced into pressure-development unit 120. The pressure developing unit 120 is comprised of a small-diameter roller 121 and a backup roller 131, in which the microcapsule sheet 137 and the developer sheet 138 are subjected to pressure developement. When the pressure development is carried out, the surface of the microcapsule sheet 137 on which the latent image is formed and the surface of the developer sheet 138 on which the developer material is coated are confronted.

The microcapsule sheet 137 and the developer sheet 138 which are held in intimate contact with each other are subjected to the pressure development by passing through a nip between rollers 121 and 131, whereupon the unexposed microcapsules are ruptured and a visible image is formed on the developer sheet 138.

The microcapsule sheet 137 and the developer sheet 138 which have passed through the pressure-developing unit 120 are conveyed by the pair of feeding rollers 122 and are separated by a peeling roller 123. The microcapsule sheet 137 is moved in the upward direction and the developer sheet 138, i.e. copy sheet, is conveyed in a direction substantially orthogonal to the moving direction of the microcapsule sheet 137. The copy sheet 138 passes through a heat fixing unit where the formation of the image is promoted, and is discharged onto a tray 127 with the image side face-up. The heat fixing unit is comprised of a hollow heat roller 129 provided with a heater 130 in its inside and a copy sheet feeding roller 128.

The microcapsule sheet 137 passes through the meander adjusting roller 124 and is wound around the take-up shaft 125. The roller 123, the heat roller 129, the heater 130 and the roller 128 constituted a conveying means.

The operation of the apparatus thus arranged will next be described.

The cover member 101 is opened and an original is placed on the carriage 102, and then a start button (not shown) is depressed to place the apparatus in operable condition. The carriage 102 moves in the rightward direction in FIG. 5 and the carriage 102 stops at a position where the left portion of the carriage 102 is irradiated by the halogen lamp 103. The carriage 102 is then moved in the leftward direction during which the halogen lamp 103 is continuously radiating. The light radiated from the halogen lamp 103 is reflected on the original and the reflected light passes through the filter 108 and the lens 109. The light being focused by the lens 109 is reflected on the reflection mirrors 111 and a latent image is formed on the microcapsule sheet 137 supported by the exposure stand 119. At this time, since the microcapsule sheet 137 is moved at the same speed as the moving speed of the carriage 102, the latent image corresponding to the picture image on the original is formed on the microcapsule sheet 137 in one-to-one correspondence.

In accordance with the movement of the platen 102 in the leftward direction, the developer sheet 138 is taken out from the cassette 132 by the actuation of the semi-circular shaped roller 133. The developer sheet 138 merges with the exposed microcapsule sheet 137 and these two sheets are introduced into the pressure-developing unit 120 where the latent image on the microcapsule sheet 137 is developed and transferred on the developer sheet 138, thereby forming a visible image on the developer sheet 138. After subjecting the developer sheet 138 to heat fixing by the heat fixing unit, it is discharged outside the recording apparatus 140. The microcapsule sheet 137 which has passed through the pressure-developing unit 120 is would around the shaft 125. The carriage 102 moves to the position where the right portion thereof is opposed to the light source, the reproduction of the original is completed and the halogen lamp 103 is light out.

According to the first embodiment of the present invention, the developer sheets are placed in the cassette 132 in upside down, that is, the surface on which the developing material is coated is placed face-down in the stacked condition, and are discharged in face-up after passing through the pressure-developing unit 120 and the heat fixing unit. Further, since the developer sheets are stacked in the cassette 132 upside down, the surface on which the developer material is coated is not scratached or damaged when it is fed out by the roller 133.

A second embodiment of the present invention will next be described with reference to FIG. 6.

Figure 6:
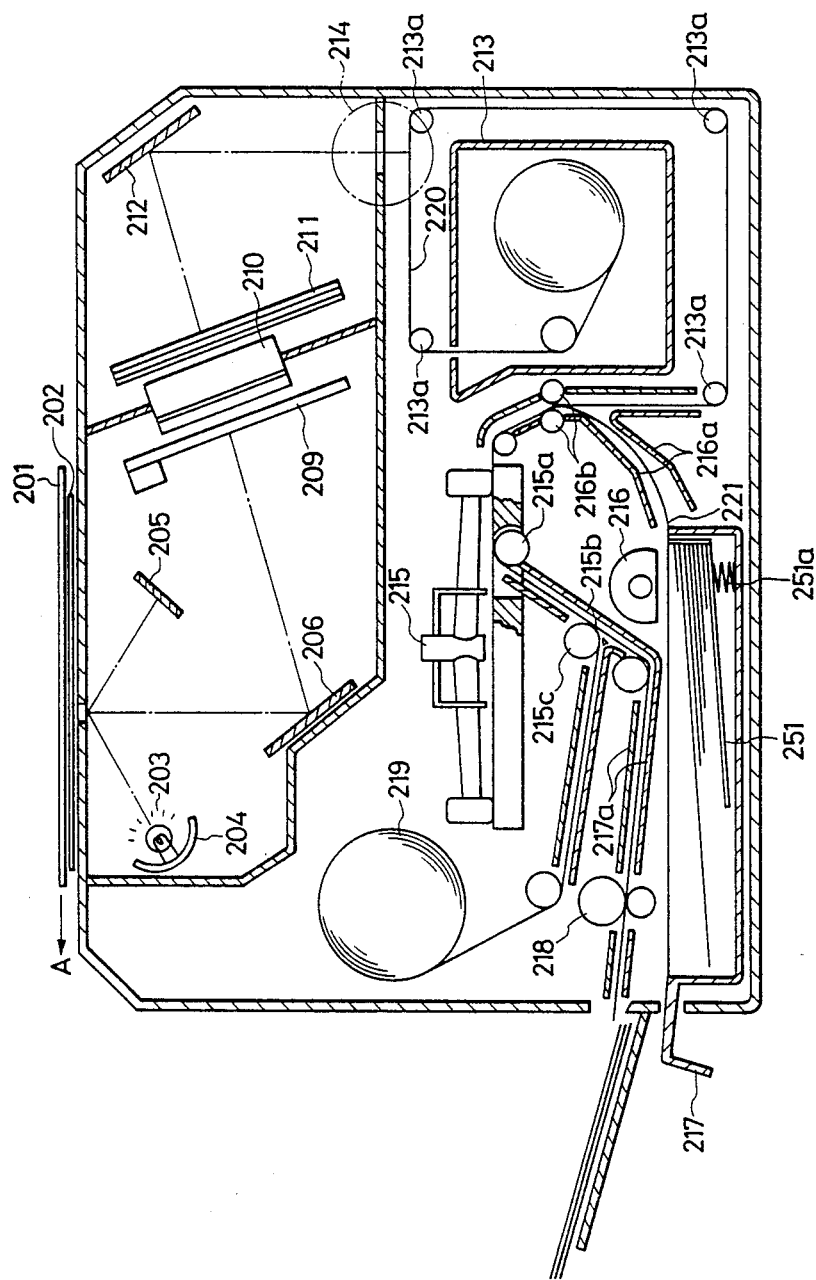
FIG. 6 is a cross-sectional side view showing a color picture image recording apparatus according to a second embodiment of the present invention.

The apparatus shown in FIG. 6 is of the type using the transfer type photosensistive and pressure-sensitive recording medium similar to the first embodiment shown in FIG. 5.

Similar to the first embodiment, an original is placed upside down on an original-mount carriage 202 made of transparent glass, and a cover member 201 is provided to cover the original. A light source 203 which may be a halogen lamp is disposed below the carriage 202 for irradiating the original on line basis. A cold mirror 204 is provided in the rear portion of the light source 203, which serves to reflect visible rays toward the original and transmit heat rays in backward.

The cover member 201 is moved by a moving unit (not shown) in the direction indicated by an arrow A together with the original when the original is exposed. That is, the original is moved in the direction A to pass through a line to which the visible ray is irradiated. To the right of light source 203, a reflection mirror 205 is provided for directing the light toward the original document. Below the line to which the visible ray is irradiated, a mirror 206 is provided to direct the reflection light in the rightward direction. To the right of reflection mirror 206, a shutter unit 209 is provided for passing or interrupting the light. A lens 210 and a filter 211 are provided to the right of shutter 209 in the stated order. The filter 211 selectively passes the colors of cyan, magenta or yellow. In the upper right portion of the apparatus, a reflection mirror 212 is provided for reflecting the light which has passed through the filter 211 in the downward direction. Beneath the reflection mirror 212, an exposure portion 214 is provided for exposing a microcapsule sheet 220. In further lower portion of the exposure portion 214, a cartridge 213 is provided for accommodating the unused microcapsule sheet 220. A plurality of feeding rollers 213a are provided around the cartridge 213 for conveying the microcapsule sheet 220, and the microcapsule sheet 220 is fed into a pressure-development unit 215. Since the microcapsule sheet 220 is conveyed at a speed in synchronization with the moving speed of the carriage 202, a latent image formed on the microcapsule sheet 220 is made to be in one-to-one correspondence with the picture image on the original.

In the lower portion of the pressure-development unit 215, a sheet cassette 217 is disposed in which cut developer sheets 221 are stacked with the surface on which the developer material is coated face-down and its reverse surface is opposed to a semi-circular roller 216 which feeds the developer sheet 221. The sheet cassette 217 is provided with an elevation plate 251 for elevating the stacked sheets and a spring 251a having one end connected to the elevation plate 215 and another end secured to the bottom of the sheet cassette 217. The sheet cassette 217 is further provided with sheet separation pieces urging two corners of the stacked sheets.

The developer sheet 221 is fed out one by one from the sheet cassette 217 in accordance with each rotation of the roller 216. The developer sheet 221 thus fed out is merged with the microcapsule sheet 220 when passing through a nip between a pair of rollers 216b. The microcapsule sheet 220 and the developer sheet 221 are introduced into a developer unit 215 where pressure-development is taken place, and then fed out in the left-lower direction by means of a roller 215a provided in the lower portion of the developer unit 215. The microcapsule sheet 220 is separated from the developer sheet 221 by a separation unit 215b and is conveyed in the upward direction through a guide roller 215c. The used microcapsule sheet 220 is wound around a take-up roller 219. The developer sheet 221 being separated from the microcapsule sheet 220 is conveyed in the leftward direction while being guided by a sheet guide unit 217a. A heat fixing unit 218 is provided in the left portion of the sheet guide unit 217a to give luster on the visible image on the developer sheet 221. The developer sheet 221 which has passed through the heat fixing unit 218 is discharged outside the apparatus.

The operation of the second embodiment will next be described.

Under the condition where the original is in an initial position, the light radiated from the light source 203 is irradiated onto the original in the form of a line stripe. The light reflected on the original is directed to the rightward direction by the reflection mirror 206 and passes through the shutter 209, the lens 210 and the filter 211. The light is then reflected on the reflection mirror 212 and directed to the downward direction to expose the microcapsule sheet 220.

When the cover member 201 starts moving in direction A together with the original document, the microcapsule sheet 220 start moving with the aid of rollers 213a. When the movement of the original is stopped, a latent image corresponding to the image of the original is completely formed on the microcapsule sheet 220. Note that the length of the microcapsule sheet 220 is longer than the longitudinal length of the original.

When the exposure onto the microcapsule sheet 220 is finished, the uppermost developer sheet 221 is fed out from the sheet cassette 217 by the roller 216 and is brought to merge with the microcapsule sheet 220 so that the developer material coated on one surface of the developer sheet 221 is in intimate contact with the surface of the microcapsule sheet 220 on which the latent image is formed. When feeding out the developer sheet 221, the roller 216 is in contact with the reverse surface of the developer sheet 221 where no developer material is coated. When the roller 216 is in contact therewith, the stacked developer sheets are downwardly urged against the resilient force of the spring 251a which upwardly biases the developer sheets 221.

Representing an elevation pressure applied by the spring 251a to the developer sheets as W and a frictional coefficient between the roller 216 and the reverse surface of the developer sheet 221 as $\mu rp$, the developer sheet 221 is forced to be moved in the frontward direction with a frictional force defined by $F_1 = \mu rp W$. The material of the roller 216 is selected so that the force $F_1$ is greater than the sum of a frictional force $F_2$ between the upper two developer sheets and a resistive force R of the separation piece, thereby allowing the uppermost developer sheet 221 to be fed out. As the roller 216 rotates, the uppermost developer sheet 211 in the cassette 217 is bent in a wavy fashion and rides aross the separation pieces provided in the front side corners of the sheet cassette 217. In this case, since the roller 216 contacts with the reverse surface of the developer sheet 221 where no developer material is coated, the developer material coated on the opposite surface of the sheet is not caused to be peeled off.

The microcapsule sheet 220 on which the latent image is formed is merged with the developer sheet 221 and both sheets are introduced into the pressure-development unit 215 while being in intimate contact with each other. In the pressure-development unit 215, unexposed microcapsules on the microcapsule sheet 220 are ruptured and the chromogenic material or dy precursor contained in the microcapsules reacts with the developer material coated on the developer sheet 221 to thereby form a visible image on the developer sheet 221.

The microcapsule sheet 220 and the developer sheet 221 discharged from the pressure-development unit 215 are directed to the leftward direction by the roller 215a and are separated from one another by a separation unit 215b. The separated microcapsule sheet 220 is conveyed to the upward direction by the roller 215c and wound around the take-up roller 219. On the other hand, the separated pressure sheet 221 is conveyed in the leftward direction and passes through the heat fixing unit 218, in which the coloring of the image on the developer sheet 221 is promoted and the image is made to be lustrous. Then, the developer sheet 221 is discharged outside the recording apparatus.

According to the second embodiment of the present invention, since the microcapsule sheet 220 taken out from the cartridge 213 is extended to travel around the cartridge 213, the developer sheet 221 can be stacked in the cassette 217 upside down. Accordingly, the feeding roller does not contact the surface of the developer sheet 221 on which the developer material is coated, and thus the developing material coating surface is not damaged and a clear image can be formed thereon.

Figure 7:
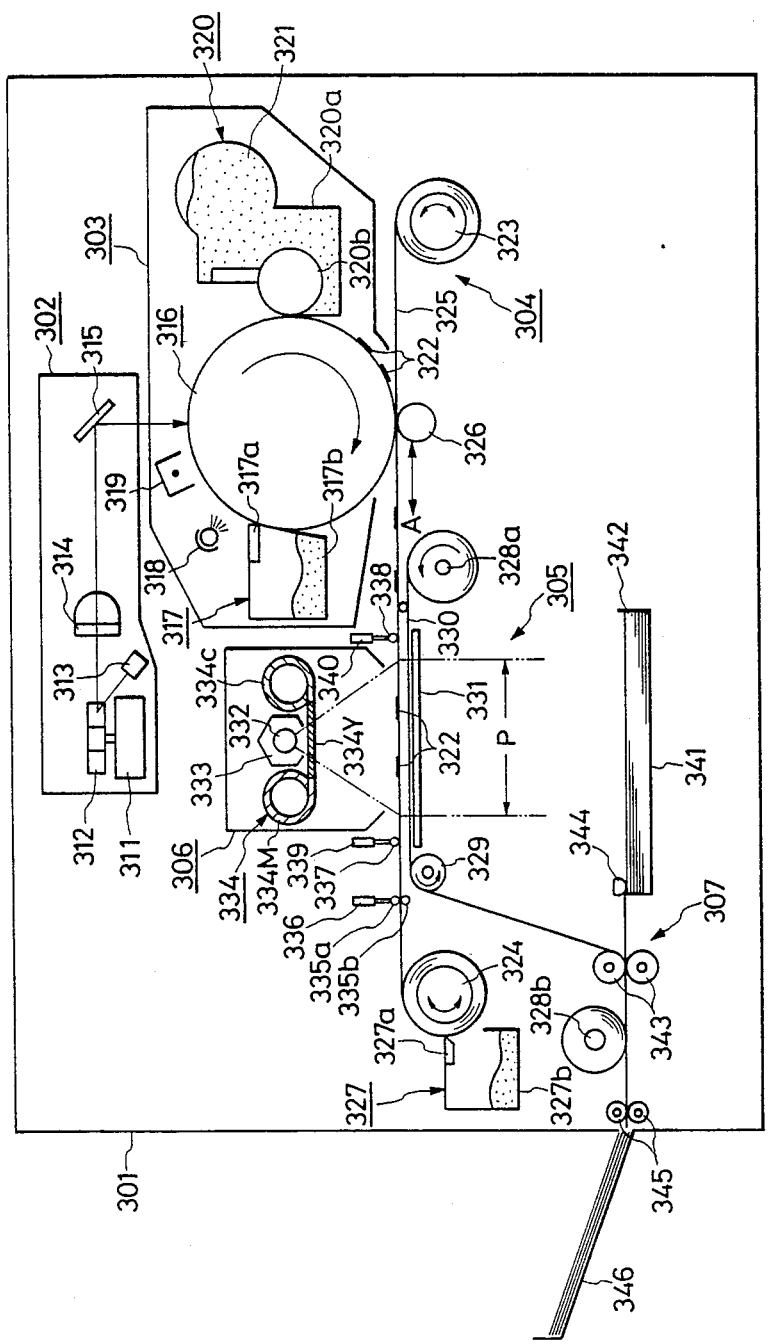
FIG. 7 is a cross-sectional side view showing a color picture image recording apparatus according to a third embodiment of the present invention.

FIG. 7 shows a color picture image recording apparatus according to the third embodiment of the present invention. Although the apparatus shown therein uses the transfer type recording medium, the self-contained type recording medium is usable in this apparatus.

As shown in FIG. 7, the apparatus includes a laser scanner unit 302, xerography unit 303, a light transmissive member transporting unit 304, a photosensitive recording sheet transporting unit 305, an exposure unit 306, and a pressure developing unit 307. The laser scanner unit 302 includes a motor 311, a multi-surfaced polygon mirror 312 rotated by the motor 311, a semiconductor laser 313 irradiating laser light onto a surface of the polygon mirror 312, an f0 lens 314, and a plane mirror 315 for directing the laser beam onto a photosensitive drum 316.

The xerography unit 303 includes a photosensitive drum 316, along the outer circumference of which a cleaning unit 317, a discharger unit 318, a precharger unit 319, an exposure zone, and a developing unit 320 are arranged in the stated order in the rotational direction of the drum 316.

In accordance with the rotations of the drum 316, residual toner powders adhered to the surface of the drum is scraped and removed by a cleaning blade 317a in the cleaning unit 317 and is recovered in a toner reservoir 317b. The residual electric charges on the drum 316 are removed by the discharger unit 318, and then the drum 316 is uniformly charged by the precharger unit 319. Under a control of a central processing unit (not shown), irradiated onto the drum 316 is light corresponding to a picure image of an original supplied from a picture image inputting unit (not shown), so that a latent image corresponding to the picture image is formed on the photosensitive drum 316. The polarity of the charges on the latent image is opposite to that of the charges charged by the precharger unit 319.

Black-color toner is contained in a toner container 320a and the toner is brought to be in slidable contact with the rotating surface of the drum 316 by a developing sleeve 320b. The black-color toner 321 serves to shield or interrupt light, and is charged to the same polarity as the polarity of the charges in the background or the non-image portion of the drum 316. Thus, a reverse-development is taken place, in which the toner powders do not adhere to the non-image portion of the drum 316 due to electrostatic repellent force but adhere only to the image portion, thereby forming a light shielding visible image 322 on the drum 316.

A normal development is also available in which irradiated onto the drum 316 is light corresponding to the background or non-image portions of the original, and the polarity of the charges in the latent image portions of the drum 316 are remained unchanged and the toner powders charged to the polarity opposite to the polarity of the latent image portions are electrostatically attracted, thereby forming a light shielding visible image 322.

The light transmissive member transporting unit 304 includes a pair of rollers 323 and 324 on which a continuous, sheet-like light transmissive member 325 made of, for example, polyehylene terephtalate are wound to be movable therebetween; a transferring roller 326 disposed beneath the drum 316 in contact with the latter with the light transmissive member 325 intervening therebetween; and a cleaning unit 327 positioned proximate to the roller 324. The transferring roller 326 is imparted with charges of opposite polarity to that of the charges of the toner 321, so that the toner 321 adhered to the surface of the drum 316 is transferred to the light transmissive member 325 and the light shielding image 322 is formed thereon. Accordingly, an image forming means for forming the light shielding image 322 on the light transmissive member 325 is constituted with the laser scanner unit 302, xerography unit 303 and the transferring roller 326. In the cleaning unit 327, a cleaning blade 327a and a toner reservoir 327b are provided. After the light transmissive member 325 on which the light shielding image 322 is formed is used as a mask member, the toner on the light transmissive member 325 is scratched and removed by the cleaning blade 327a and recovered in the toner reservoir 327b.

The microcapsule sheet transporting unit 305 is disposed beneath the exposure unit 306, in which a pair of rollers 328a and 328b are provided so that a microcapsule sheet 330 wound on the roller 328a is taken up by the roller 328b through a guide roller 329. The microcapsule sheet 330 passes an exposure zone P of the exposure unit 306. An exposure stand 331 is disposed beneath the exposure unit 306 to support the microcapsule sheet 330.

The exposure unit 306 constitutes an exposure means for forming a latent image on the microcapsule sheet 330 corresponding to the mask of the light transmissive member 325 on which the light shielding image 322 is formed. The exposure unit 306 includes an exposure lamp 332, a light concentration member 333, and an interference filter 334 transmitting only light of colors having wavelengths of cyan, magenta and yellow 334.

Filter segments 334Y, 334M and 334C corresponding respectively to yellow, magenta and cyan are selectively arranged in an optical path, and light emitted from the exposure lamp 332 is irradiated onto the light transmissive member 325 on which the light shielding image 322 is formed and accordingly the microcapsule sheet 330 is exposed. As a result, in the region of the microcapsule sheet 330 where the light is not interrupted by the light shielding image 322, the microcapsoles of a particular color are photocured, and a latent image corresponding to the light shielding image 322 is formed on the microcapsule sheet 330.

Figure 8:
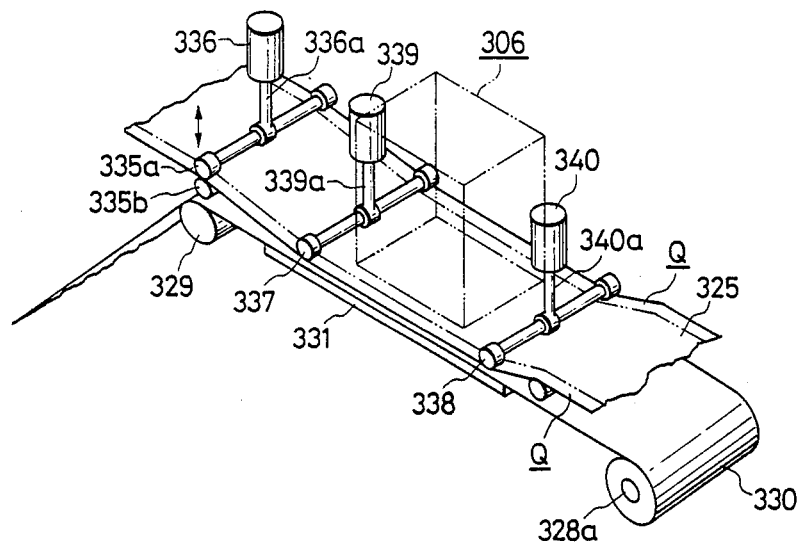
FIG. 8 is a perspective view showing an urging means to be used in the third embodiment shown in FIG. 7.

As shown in FIG. 8, a pair of rollers 335a and 335b are provided in the downstream of an exposure zone P in the running direction of the light shielding member 325. The member 325 passes through a nip between the rollers 335a and 335b and is supported by these rollers. The rollers 335a and 335b are in contact with both marginal non-image portions Q each extending in the running direction of the member 325. The roller 335a is coupled to an armature 336a of a solenoid 336 and moves toward and away from the front surface of the member 325 in accordance with excitation or deexcitation of the solenoid 336, thereby holding the member 325 together with the stationary roller 335b which is in contact with the reverse surface of the member 325 or releasing the holding of the member 325. In the upstream and downstream of the exposure unit 306 in the running direction of the light transmissive member 325, pressing rollers 338 and 337 are respectively provided which are in contact with the non-image portions Q. The pressing rollers 337 and 338 are coupled respectively to solenoids 339 and 340, and their associated armatures 339a and 340a are protruded in response to excitations of the solenoids 339 and 340. With the protrusions of the armatures 339a and 340a, both sides of the non-image portions Q of the member 25 are urged downwardly so that the member 25 and the photosensitive recording sheet 330 are brought to be in intimate contact with each other. The pressing rollers 337 and 338 and the solenoids 339 and 340 constitute a pressing means.

Referring back to FIG. 7, developer sheets 342 are stacked in a sheet cassette 341 disposed beneath the exposure stand 331. On the developer sheet 342, a developer material is coated which reacts with chromogenic material or dye precursor contained in the microcapsules on the microcapsule sheet 330. A pair of pressing rollers 343 serving as a developing means are provided proximate the sheet cassette 341. The pressing rollers 343 feed the developer sheet 342 one by one in accordance with the rotation of a sheet feeding roller 344, and the microcapsule sheet 330 is overlaid on the developer sheet 342. The microcapsule sheet 330 and the developer sheet 342 pass through a nip between the rollers 343 while being pressed thereby. When passing through the nip between the rollers 343, the microcapsules 330b coated on the lower surface of the microcapsule sheet 330 which have not yet photo-cured are ruptured and the chromogenic material or dye precursor in the capsules 330b flow out and react with the developer matereial coated on the developer sheet 342. Thus, the latent image on the microcapsule sheet 330 is developed and a visible image is formed on the developer sheet 342. The developer sheet 342 on which the visible image is formed is discharged onto a tray 346 in accordance with the operation of a feed-out rollers 345.

Next, the operations of the color picure image recording apparatus thus arranged will be described.

Figure 9A:
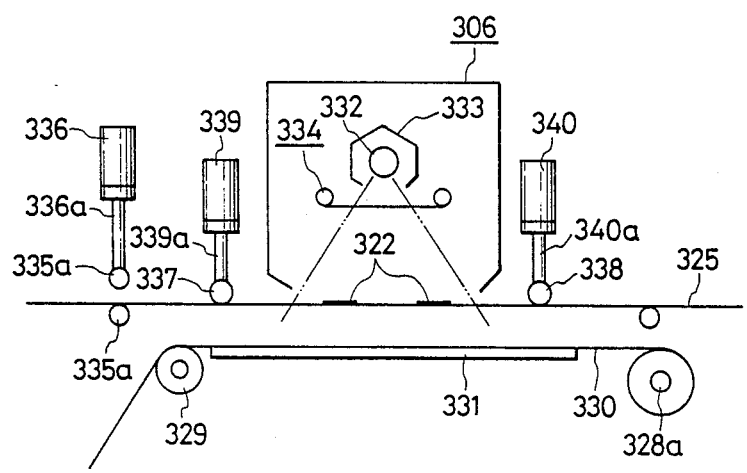
FIGS. 9A through 9C are cross-sectional side views for describing operational conditions of the urging means shown in FIG. 8.
Figure 9B:
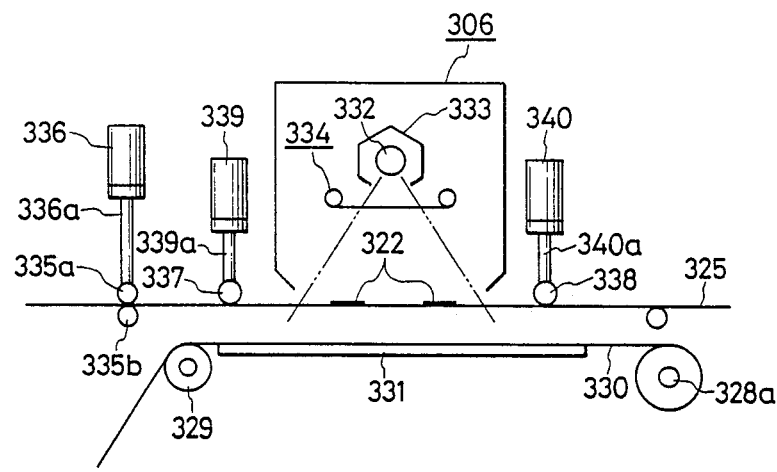
Figure 9C:
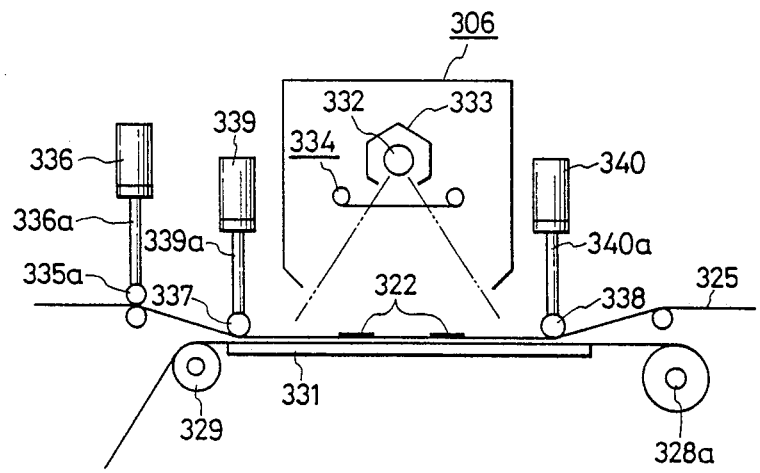
Figure 10:
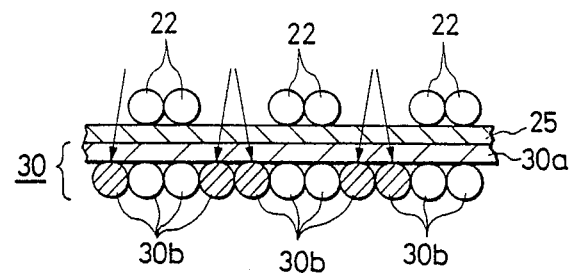
FIG. 10 is an enlarged cross-sectional side view for showing a state of exposure according to the third embodiment of the invention.

In the appratus according to the third embodiment, a latent image is formed on the microcapsule sheet 330 in the order of, for example, yellow, magenta and cyan. Specifically, a latent image corresponding to yellow is formed by the laser scanner unit 302 on the photosensitive drum 316 rotating in the clockwise direction as indicated by an arrow in FIG. 7 and is developed by the developing unit 320. The developed image on the drum 316 is then transferred by the transferring roller 326 to the light transmissive member 325 moving in the direction indicated by an arrow so as to form a light shielding image on the light transmissive member 325. The light transmissive member 325 on which the light shielding image 322 is formed is travelled by the rotations of the take-up roller 324 and disposed beneath the exposure unit 306. As shown in FIG. 9A, the light transmissive member 325 is placed above the microcapsule sheet 330 with a spacing therebetween. When the solenoid 336 is excitated, the roller 335a coupled to the armature 336a is moved downwardly, so that both the marginal non-image portions Q of the light transmissive member 325 are fixed between the rollers 335a and 335b as shown in FIG. 9B. With the excitations of the solenoids 339 and 340, pressing rollers 337 and 338 coupled respectively to armatures 339a and 340a of solenoids 339 and 340 are moved downwardly to depress the non-image portions Q of the light transmitting member 325. The light transmitting member 325 and the microcapsule sheet 330 are brought to be in intimate contact with each other and supported by the exposure stand 331 as shown in FIG. 9C.

In the exposure unit 306, the yellow filter segment 334Y of the interference filter 334 is selectively disposed in an optical path. Light is irradiated through the filter segment 334Y to the light transmitting member 325 on which the light shielding image 322 is formed and the microcapsule sheet 330. Among the microcapsules 330b corresponding to yellow, those which have not received light due to the light-shielding image 322 are not photo-cured, whereas the remaining microcapsules 330b which have received light are photo-cured. The latent image corresponding to yellow is thus formed on the microcapsule sheet 330. After the latent image of yellow is formed on the microcapsule sheet 330, the solenoids 339 and 340 are deexcited to move the the pressing rollers 337 and 338 upwardly. The light transmissive member 329 moves upwardly due to its tension, and the light transmissive member 325 and the microcapsule sheet 330 are separated. Thereafter, the solenoid 336 is deexcited to cause the roller 335a to move upwardly. The light transmissive member 325 is released from the rollers 335 and 336b and is placed to a state to be taken up by the roller 324.

The light transmissive member 325 is taken up by the roller 324 and the light shielding image 322 corresponding to yellow on the light transmissive member 325 is removed by the cleaning unit 327. The light transmissive member 325 is then rewound on the roller 323 by moving it in the direction opposite to the direction A. The transfer starting position of the visible yellow image is aligned corresponding to the position of the transferring roller 326. At this time, the microcapusule sheet 330 is placed stationary in the exposure area P of the exposure unit 306.

The latent image of each of magenta and cyan is formed on the microcapsule sheet 330 in similar fashion as is done with respect to yellow. That is, after transferring the light shielding image 322 corresponding to each of magenta and cyan formed on the photosensitive drum 316 to the light transmissive member 325, the latter member is sequentially disposed beneath the exposure unit 306. The solenoids 336, 339 and 340 are excited so that their associated rollers 335a, 337 and 338 depress the light transmissive member 325 and the microcapsule sheet 330 so as to be in intimate contact with each other. The light is irradiated onto the light transmissive member 325 while selectively disposing the magenta filter segment 335M or the cyan filter segment 335C in the optical path of the exposing unit 306. The latent image coresponding to the magenta or cyan is formed on the microcapsule sheet 30. Upon completion of the formation of the latent images of the respective colors, the microcapsule sheet 330 is moved in accordance with rotations of the take-up roller 326b and is overlaid the developer sheet 342 which is supplied from the sheet cassette 341. The microcapsule sheet 330 and the developer sheet 342 pass through a nip between the pressing rollers 343. The microcapsules 330b on the microcapsule sheet 330 which have not photo-cured are ruptured and the chromogenic material contained in the microcapsules flow away and react with the developer material on the developer sheet 342. The latent images on the microcapsule sheet 330 are thus developed and a visible color image appears on the developer sheet 342. The developer sheet is discharged on the tray 346 by the actuation of the feed-out roller 345.

As described, according to the third embodiment of the present invention, a pressing means comprising the pressing rollers 337 and 338 and their associated solenoids 339 and 340 are used, and due to the operation of the pressing means, the light transmissive member 325 and the microcapsule sheet 330 are held in intimate contact with each osther at the time of exposure. Therefore, the light shielding image on the light transmissive member 25 is sharply projected on the microcapsule sheet 330. Therefore, a clear image with no blur is formed on the microcapsule sheet 330.

Next, a modification of the pressing means will be described with reference to FIGS. 11 through 12C.

In this modification, a recutangular-shaped pressing frame 351 supported by a pair of solenoids 352 and 353 is employed which serves as the pressing means.

Figure 11:
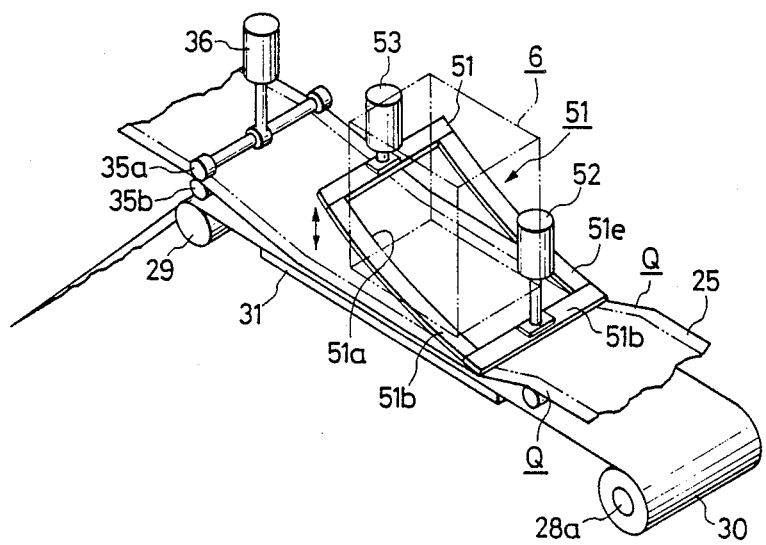
FIG. 11 is a perspective view showing a modification of the urging means shown in FIG. 8.

As shown in FIG. 11, the rectangular-shaped pressing frame 351 is provided between the exposure unit 306 and the light transmissive member 325. The inner opening 351a of the frame 351 is substantially the same size as that of the exposure area P.

Frame members 351b and 351c of the frame 351 arranged in the widthwise direction of the light transmitting member 325 are made of a rigid material. Frame members 351d and 351e arranged in the travelling direction of the light transmissive member 325 are made of a resilent material. The pressing frame 351 is supported in suspension by a pair of solenoids 352 and 353 attached respectively to the frame emembers 351b and 351c. The frame 351 is positioned beneath the exposure unit 306 and normally slightly apart from the light transmissive member 325.

Figure 12A:
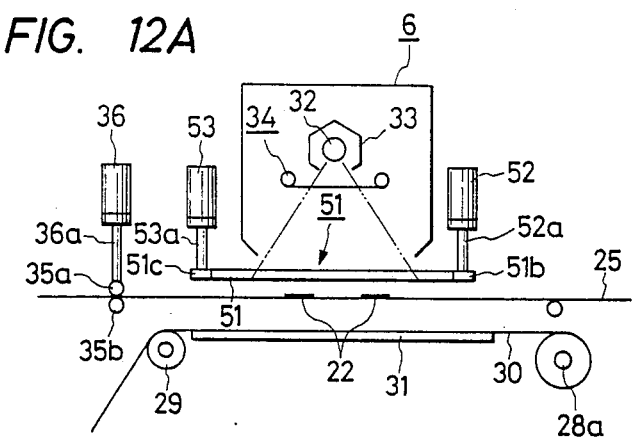
FIGS. 12A through 12C are cross-sectional side views for describing operational conditions of the urging means shown in FIG. 11.
Figure 12B:
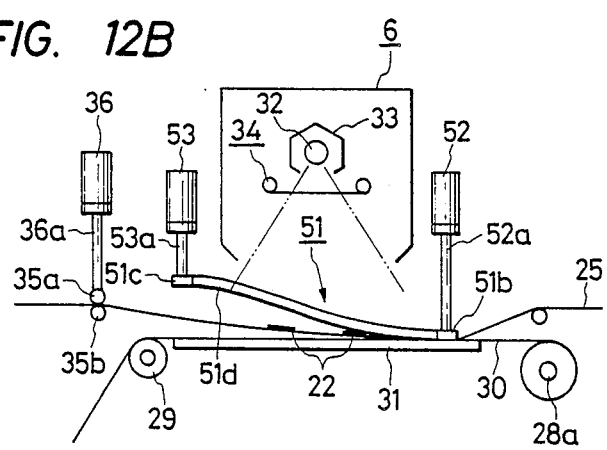
Figure 12C:
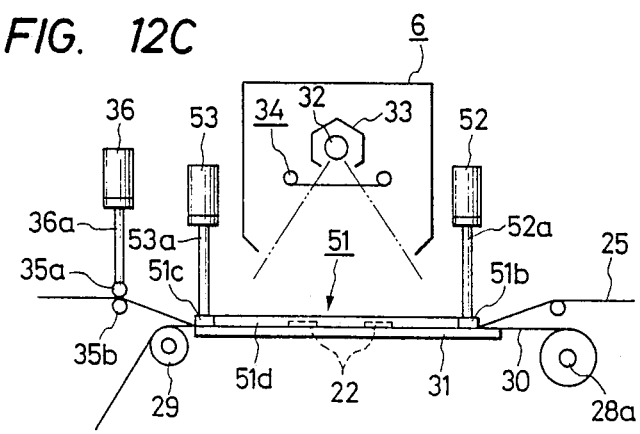

After disposing the light transmissive member 325 on which the light shielding image 322 corresponding to a prescribed color is formed in the exposure area P of the exposure unit 306, the solenoid 336 is excited to fixedly hold the light transmissive member 325 by the pair of rollers 335a and 335b as shown in FIG. 12A. Then, with excitation of the solenoid 352, its associated armature 352a is protruded and the frame member 351b is downwardly urged. The frame 351 is resiliently bent as shown in FIG. 11B and the widthwise portion of the light transmissive member 325 is fixedly held between the frame member 351b and the exposure stand 331. The light transmissive member 325 is thus held in suspension with by means of the rollers 335a and 335b and the frame member 351b. Next, with excitation of another solenoid 353, its associated armature 353a is downwardly protruded and the frame members 351d and 351e urge the non-image portion Q of the light transmissive member 325. When the frame member 351c is moved to the lowermost position, the light transmissive member 325 and the microcapsule sheet 330 are held to intimately contact with each other.

According to this modification, a clear picture image can also be formed on the microcapsule sheet 330, since the light transmissive member 325 and the microcapsule sheet 330 are held to intimately contact with each other at the time of exposure.

Although the present invention has been described with reference to specific embodiments, it will be appreciated that a variety of changes or modifications may be made without departing from the scope and spirit of the invention.

In the third embodiment shown in FIG. 7:

(1) A magnetography device or thermomagnetography device are available for the photosensitive drum 316;

(2) A light transmissive dielectric material may be used as a material for the light transmissive medium 325, in which case an electrostatic latent image is directly formed thereon with the use of an electrostatically recording head;

(3) A light transmissive magnetic material may be used as a material for the light transmissive medium 325, in which case magnetography device or thermomagnetography device is used to directly form a magnetic latent image thereon;

(4) A photosensitive recording sheet is usable in the place of the light transmissive medium 325, in which case the developer sheet 342 needs not be provided;

(5) A microcapsule sheet is usable in which only a single color chromogenic material selected from the colors of black, yellow, magenta and cyan is contained in the pressure rupturable microcapsules; and (6) A dot impact type or thermal transfer type device is usable as the image forming means.

Although it has been described throughout the various embodiments that the microcapsule on the recording sheet contains a photo-curing material and a chromogenic material and these materials are photo-cured when exposed, i.e. a mechanical strength of the microcapsule is increased when exposed, a different type of the microcapsule sheet may be employed such that the microcapsule thereon contains a photosensitive material and a chromogenic material and the mechanical strength of the microcapsule is decreased when exposed due to the softening of the photosensitive material.

What is claimed is:

1. An image recording apparatus for recording on a recording medium an image of an original, said recording medium comprising a first medium having a first surface carrying a first material and a second surface, and a second medium having a first surface carrying a second material and a second surface, said first medium being in the form of an elongated, web-like continuous sheet and said second medium being in the form of a cut sheet, said apparatus comprising:

means for exposing said first medium to an image bearing light to form a latent image thereon corresponding to said image of said original;

means for developing said latent image according to a reaction of said first material with said second material to form a visible image on said first surface of said second medium;

means for introducing said first and second mediums into said developing means, said first surface of said first medium and said first surface of said second medium being held in facial contact with each other when introduced thereinto;

means for separating said second medium from said first medium after being subjected to development by said developing means; and means for conveying said second medium with said first surface of said second medium face-up.

2. The image recording apparatus as recited in claim 1, further comprising:

first supplying means for supplying said first medium;

first receiving means for receiving said first medium supplied from said first supplying means;

second supplying means for supplying said second medium, said second supplying means being located in a lower position with respect to said first supplying means;

second receiving means for receiving said second medium supplied from said second supplying means, wherein a plurality of said second mediums are stacked in said second supplying means with said first surface of each said second medium face-down;

feeding means for feeding said second medium stacked in said second supplying means to said introducing means, said feeding means being in contact with said second surface of said second medium.

3. The image recording apparatus as recited in claim 2, wherein said developing means carries out pressure development.

4. The image recording apparatus as recited in claim 3, wherein said first medium is a photosensitive and pressure-sensitive sheet.

5. The image recording apparatus as recited in claim 3, wherein said first material comprises a photosensitive material and a dye precursor selected from the colors comprising cyan, magenta and yellow, and said second material comprises a coloring agent, and wherein said photosensitive material and said dye precursor are encapsulated in a pressure rupturable microcapsule and a mechanical strength of said microcapsule varies when exposed.

6. The image recording apparatus as recited in claim 3, wherein said first material comprises a photo-curing resin and a dye precursor selected from the colors comprising cyan, magenta and yellow, and said second material comprises a coloring agent, and wherein said photo-curing resin and said dye precursor are encapsulated in a pressure rupturable microcapsule and said photo-curing resin and said dye precursor are photo-cured when exposed.

7. The image recording apparatus as recited in claim 2, wherein said feeding means comprises a semi-circular roller, said semi-circular roller being rotatably provided above said second supply means.

8. An image recording apparatus for recording an image of an original on a recording medium, said recording medium including a first medium carrying on its surface a first material and a second medium carrying on its surface a second material, said apparatus comprising: means for forming on a light transmissive member a light shielding image corresponding to the image of said original, said light transmissive member carrying the light shielding image serving as a mask member; means for exposing light onto said first medium through said mask member to form on said first medium a latent image corresponding to the light shielding image on said mask member; means for maintaining said mask member and said first medium to be in intimate contact with each other when exposure is taking place; and means for developing said latent image on said first medium to form a visible image on said second medium according to the reaction of said first material with said second material.

9. The image recording apparatus as recited in claim 8, wherein said developing means carries out pressure development.

10. The image recording apparatus as recited in claim 8, wherein said first medium is in the form of an elongated, web-like continuous sheet.

11. The image recording apparatus as recited in claim 9, wherein said first medium is a photosensitive and pressure-sensitive sheet.

12. The image recording apparatus as recited in claim 11, wherein said first material comprises a photosensitive material and a dye precursor selected from the colors comprising cyan, magenta and yellow, and said second material comprises a coloring agent, said coloring agent being coated on a first surface of said second medium, and wherein said photosensitive material and said dye precursor are encapsulated in a pressure rupturable microcapsule and a mechanical strength of said microcapsule varies when exposed.

13. The image recording apparatus as recited in claim 11, wherein said first material comprises photo-curing resin and a dye precursor selected from the colors comprising cyan, magenta and yellow, and said second material comprises a coloring agent, said coloring agent being coated on a first surface of said second medium, and wherein said photo-curing resin and said dye precursor are encapsulated in a pressure rupturable microcapsule and said photo-curing resin and said dye precursor are photo-cured when exposed.

14. The image recording apparatus as recited in claim 8, wherein said maintaining means comprises a first member and a second member, said first member being provided outside an exposure region and in an upstream with respect to the movement of said mask member and said second member being provided outside the exposure region and in a downstream direction with respect thereto.

15. The image recording apparatus as recited in claim 14, wherein said first member comprises a first solenoid, a first armature connected to said first solenoid and a first roller member coupled to said first armature, and said second member comprises a second solenoid, a second armature connected to said second solenoid and a second roller member coupled to said second armature, and wherein when said first and second armatures are excited, said first and second roller members extend to maintain said mask member and said first medium to be in intimate contact with each other.

16. The image recording apparatus as recited in claim 15, wherein said first and second roller members are in contact with marginal portions of said mask member where no light shielding images are present.

17. The image recording apparatus as recited claim 8, wherein said maintaining means comprises a rectangular-shaped frame member.

18. The image recording apparatus as recited in claim 17, wherein said rectangular-shaped frame member comprises a first frame element, a second frame element, a third frame element and a fourth frame element, each of said frame elements being rigidly secured to one another to thereby form a rectangular shape, wherein said first and third frame elements are made of a rigid material and said said second and fourth frame elements are made of resilient material, and wherein said rectangular-shaped frame member maintains said mask member and said first medium in such a manner that said first and third frame elements urge transversal portions of said mask member and said second and fourth frame elements urge marginal side portions in the direction of movement of said mask member.

19. The image recording apparatus as recited in claim 18, wherein said maintaining means further comprises a third solenoid and a third armature having one end connected to said third solenoid and another end fixedly secured to said first frame element and a fourth solenoid and a fourth armature having one end connected to said fourth solenoid and another end fixedly secured to said third frame element, said third and fourth solenoids downwardly extend to urge said first and third frame elements when said third and fourth solenoids are excited.

20. An image recording apparatus for recording an image of an original on a photosensitive and pressure-sensitive recording medium, one surface of said recording medium being coated with pressure rupturable encapsulated chromogenic material and a developer material, said apparatus comprising: means for supporting said original; means for forming on a light transmissive member a light shielding image corresponding to the image of said original, said light transmissive member carrying the light shielding image serving as a mask member; means for supplying said recording medium; means for receiving said recording medium supplied from said supplying means; means for exposing light onto said first medium through said mask member to form on said recording medium a latent image corresponding to the light shielding image; means for maintaining said mask member and said recording medium in intimate contact with each other when exposure is taking place; and means for pressure-developing said latent image on said recording medium to form a visible image thereon according to the reaction of said chromogenic material and said developer material.

21. In an image recording apparatus wherein a latent image corresponding to an image of a first medium is formed on a second medium upon exposure, a device for maintaining said first medium and said second medium in intimate contact with each other when exposure is taking place, comprising: a first solenoid, a first armature connected to said first solenoid and a first roller member coupled to said first armature; and a second solenoid, a second armature connected to said second solenoid and a second roller member coupled to said second armature, wherein when said first and second armatures are excited, said first and second roller members extend to urge said first and said second mediums.

22. In an image recording apparatus wherein a latent image corresponding to an image on a first medium is formed on a second medium upon exposure, a device for maintaining said first member and said second member in intimate contact with each other when exposure is taking place, comprising: a rectangular-shaped frame member including a first frame element, a second frame element, a third frame element and a fourth frame element, each of said frame elements being rigidly secured to one another to thereby form a rectangular shape, wherein said first and third frame elements are made of a rigid material and said second and forth frame elements are made of a resilient material, and wherein said rectangular-shaped frame member urges said first and said second medium in such a manner that said first and third frame elements urge portions of said first medium in a first direction and said second and fourth frame elements urge portions of said first medium in a second direction orthogonal to said first direction.

* * * * *